(12) United States Patent
Hsieh et al.

(10) Patent No.: US 10,026,551 B2
(45) Date of Patent: Jul. 17, 2018

(54) MAGNETIC CAPACITOR STRUCTURES

(71) Applicant: INDUSTRIAL TECHNOLOGY RESEARCH INSTITUTE, Hsinchu (TW)

(72) Inventors: Cho-Fan Hsieh, Luodong Township (TW); Chih-Hua Chen, Taipei (TW); Hung-Sen Wu, Taoyuan (TW); Teng-Chun Wu, Jinning Township (TW); Ming-Han Liao, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 34 days.

(21) Appl. No.: 14/737,152

(22) Filed: Jun. 11, 2015

(65) Prior Publication Data

US 2015/0371777 A1    Dec. 24, 2015

Related U.S. Application Data

(60) Provisional application No. 62/015,786, filed on Jun. 23, 2014.

(30) Foreign Application Priority Data

Dec. 24, 2014    (TW) .............................. 103145160 A

(51) Int. Cl.
*H01G 4/008*    (2006.01)
*H01G 4/10*    (2006.01)
(Continued)

(52) U.S. Cl.
CPC ................ *H01G 4/10* (2013.01); *H01G 4/008* (2013.01); *H01G 4/01* (2013.01); *H01G 4/33* (2013.01); *H01L 28/75* (2013.01); *H01G 4/1218* (2013.01)

(58) Field of Classification Search
CPC ............ H01G 4/10; H01G 4/008; H01G 7/06; H01G 9/15; H01G 4/06
See application file for complete search history.

(56) References Cited

U.S. PATENT DOCUMENTS 6,219,113 B1    4/2001    Takahara
6,628,355 B1    9/2003    Takahara
(Continued)

FOREIGN PATENT DOCUMENTS

TW    201023217 A1    6/2010

OTHER PUBLICATIONS

Taiwanese Office Action dated Nov. 24, 2015, for Application No. 103145160.
(Continued)

*Primary Examiner* — Nguyen Ha
(74) *Attorney, Agent, or Firm* — Birch, Stewart, Kolasch & Birch, LLP

(57) ABSTRACT

The present disclosure provides a magnetic capacitor structure including a first electrode, a second electrode opposite to the first electrode, a dielectric layer disposed between the first electrode and the second electrode, a first magnetic layer disposed between the first electrode and the dielectric layer, a second magnetic layer disposed between the second electrode and the dielectric layer, a first oxide layer disposed between the first electrode and the first magnetic layer, and a second oxide layer disposed between the second magnetic layer and the dielectric layer.

9 Claims, 3 Drawing Sheets

(51) Int. Cl.
*H01G 4/01* (2006.01)
*H01G 4/33* (2006.01)
*H01L 49/02* (2006.01)
*H01G 4/12* (2006.01)

(56) References Cited

U.S. PATENT DOCUMENTS

| | | | | |
|---|---|---|---|---|
| 7,821,771 | B2* | 10/2010 | Lai | H01G 7/00 361/502 |
| 7,911,187 | B2 | 3/2011 | Lai et al. | |
| 9,779,878 | B2* | 10/2017 | Hong | H01G 7/06 |
| 2001/0023951 | A1* | 9/2001 | Lee | H01L 28/55 257/295 |
| 2003/0022030 | A1* | 1/2003 | Chang | C23C 14/088 428/701 |
| 2006/0082390 | A1* | 4/2006 | Bouche | B82Y 25/00 327/1 |
| 2007/0247784 | A1* | 10/2007 | Wang | H01G 4/005 361/311 |
| 2009/0289289 | A1 | 11/2009 | Lai | |
| 2010/0214718 | A1* | 8/2010 | Yeh | H01G 4/008 361/305 |
| 2011/0051313 | A1* | 3/2011 | Hwang | H01G 4/20 361/311 |
| 2012/0099240 | A1* | 4/2012 | Chang | H01G 4/002 361/301.1 |
| 2014/0042987 | A1 | 2/2014 | Lai | |
| 2014/0103469 | A1 | 4/2014 | Jan et al. | |
| 2014/0264463 | A1* | 9/2014 | Chou | H01L 27/228 257/252 |
| 2014/0313637 | A1* | 10/2014 | Shukh | H01G 4/008 361/523 |
| 2015/0179345 | A1* | 6/2015 | Hong | H01G 4/008 361/281 |

OTHER PUBLICATIONS

Huang,"Study of Dielectric Property Enhancement with Different Directions and Sizes Magnetic Moment in Magnetic Complex Thin Film", Master Thesis, Department of Mechanical Engineering, College of Engineering, National Taiwan University, Jun. 2014, pp. 1-125.

Peng et al.,"L10 FePt—MgO perpendicular thin film deposited by alternating sputtering at elevated temperature", Journal of Applied Physics, vol. 99, 08F907, 2006, pp. 1-4.

Pikul et al.,"High-power lithium ion microbatteries from interdigitated three-dimensional bicontinuous nanoporous electrodes", Nature Communications, vol. 4:1732, Apr. 16, 2013, pp. 1-5.

Tomou et al.,"L10 ordering and magnetic interactions in FePt nanoparticles embedded in MgO and SiO2 shell matrices", Journal of Applied Physics, vol. 102, 023910, 2007, pp. 1-6.

* cited by examiner

MAGNETIC CAPACITOR STRUCTURES

CROSS REFERENCE TO RELATED APPLICATION

The present application is based on, and claims priority from, Taiwan (International) Application Serial Number 103145160, filed on Dec. 24, 2014, and U.S. Provisional Application Ser. No. 62/015,786, filed on Jun. 23, 2014, the disclosure of which is hereby incorporated by reference herein in its entirety.

TECHNICAL FIELD

The present disclosure is a magnetic capacitor structure, and more particularly, to a magnetic capacitance structure having double-layer magnetic layer.

TECHNICAL BACKGROUND

In general, the structure of the parallel plate capacitor consists of two parallel metal plates (electrodes) and intermediate insulating (dielectric) material composition, the capacitance value stored in the parallel plate capacitor can be calculated by Equation (1):

$$C = \frac{\varepsilon_0 \varepsilon_k f_{CMC} A}{r} \quad (1)$$

C represents the capacitance value stored in the parallel plate capacitor, $\varepsilon_0$ represents the vacuum permittivity, $\varepsilon_k$ represents the relative permittivity of the dielectric material, $f_{CMC}$ represents colossal magnetocapacitance factor, A represents the electrode surface area, and r is the distance between the electrodes. Equation (1) shows that the capacitance value of the parallel plate capacitor may be proportional to the relative permittivity of the dielectric material ($\varepsilon_k$). The parallel plate capacitor as described above, in the case that A and r are fixed, in order to increase the capacitance value of the parallel plate capacitor, increasing the relative permittivity of the dielectric material ($\varepsilon_k$) may be considered.

TECHNICAL SUMMARY

In one embodiment, the present disclosure provides a magnetic capacitor structure including a first electrode, a second electrode opposite to the first electrode, a dielectric layer disposed between the first electrode and the second electrode, a first magnetic layer disposed between the first electrode and the dielectric layer, a second magnetic layer disposed between the second electrode and the dielectric layer, a first oxide layer disposed between the first electrode and the first magnetic layer, and a second oxide layer disposed between the second magnetic layer and the dielectric layer.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1:
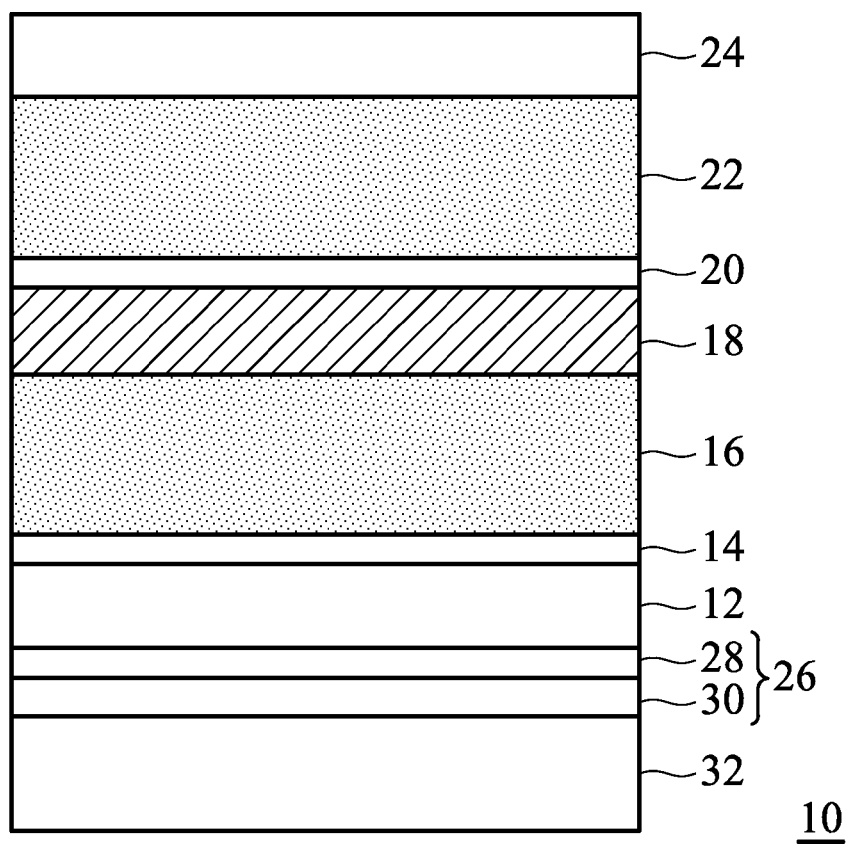
FIG. 1 shows a magnetic capacitor structure according to an embodiment of the disclosure.

FIG. 1 shows a magnetic capacitor structure according to an embodiment of the disclosure. The magnetic capacitor structure 10 includes a first electrode 12, a second electrode 24, a dielectric layer 18, a first magnetic layer 16, a second magnetic layer 22, a first oxide layer 14 and a second oxide layer 20. The second electrode 24 is disposed opposite to the first electrode 12. The dielectric layer 18 is disposed between first electrode 12 and the second electrode 24. The first magnetic layer is disposed between the first electrode 12 and the dielectric layer 18. The second magnetic layer is disposed between the second electrode 24 and the dielectric layer 18. The first oxide layer 14 is disposed between the first electrode layer 12 and the first magnetic layer 16. The second oxide layer is disposed between the second magnetic layer 22 and the dielectric layer 18.

The first electrode 12 and the second electrode 24 are composed platinum (Pt) or aluminum (Al).

The dielectric layer 18 is composed of silicon oxide, titanium oxide, barium titanate ($BaTiO_3$), or chromium based spinel ($CdCr_2S_4$). The crystalline phases of the dielectric layer 18 include an amorphous phase and a cubic phase. The grain size of the dielectric layer 18 is substantially between 100 nm to 300 nm.

The first magnetic layer 16 and the second magnetic layer 22 are composed of iron-platinum alloy (FePt) or cobalt-platinum alloy (CoPt).

The first oxide layer 14 and the second oxide layer 20 are composed of magnesium oxide (MgO), lanthanum strontium manganite (LSMO) or lead zirconium titanate (PZT).

The magnetic capacitor structure 10 further includes a passivation layer 26 forming on the first electrode 12 or the second electrode 24. The passivation layer 26 is composed of a metal layer 28, a metal oxide or metal nitride layer 30 or the combinations thereof. The metal layer 28 is composed of titanium (Ti) or tantalum (Ta). The metal oxide or the metal nitride layer 30 are composed of silicon oxides, titanium nitrides or tantalum nitrides.

The magnetic capacitor structure 10 further includes a silicon substrate 32 forming on the passivation layer 26.

Referring FIG. 1, a method for fabricating a magnetic capacitor structure is provided according to the embodiment of the disclosure. First, growing the metal layer 28 on the metal oxide or the metal nitride layer 30 by sputtering techniques, in which the metal layer 28 is used as an adhesive layer between the metal oxide or the metal nitride layer 30 and the first electrode 12. The sample is disposed in a chamber evacuated by a turbo pump. When the chamber reaches a vacuum of $3 \times 10^{-5} \sim 3 \times 10^{-7}$ torr, introducing the inert gas and adjusting the required gas flow by the mass flow controller (MFC). Then, turning on the power generator, which has a better sputtering yield for metal target. After turning on the power generator, the pre-sputtering is performed for removing the contaminants and oxides on the target surface. After the pre-sputtering is finished and the required gas flow reaches steady and static states, opening the shutter to perform the sputtering growth of the metal layer 28.

After the sputtering growth of the metal layer 28, the first electrode 12 can be successfully grown on the metal oxide or the metal nitride layer 30 because of the high adhesive ability between the metal layer 28 and the first electrode 12. The sputtering growth of the first electrode 12 is subcutaneously similar to the sputtering growth of the metal layer 28, but the only difference is that the DC power generator is used for the sputtering growth of the first electrode 12.

The sample is then disposed into a chamber of a magnetron sputter and the chamber is evacuated down to $5\times10^{-5} \sim 5\times10^{-7}$ torr. The first oxide layer 14 is heated to 200° C.-500° C. to increase its crystallinity for inducing perpendicular magnetic moments of the first magnetic layer 16. After that, the inert gas is introduced into the chamber and the required gas flow is adjusted by the MFC. Then, turning on the power generator and the pre-sputtering is performed for removing the contaminants and oxides on the target surface. After the pre-sputtering is finished and the required gas flow reaches steady and static states, opening the shutter to perform the sputtering growth of the first oxide layer 14.

After the sputtering growth of the first oxide layer 14, the plasma of target of the first oxide layer 14 is turned off. At the same time, the temperature is heated up to 500° C.-800° C. and the first magnetic layer 16 is grown by sputtering techniques.

In order to make the first magnetic layer 16 has better crystallinity and ordering, a post-annealing procedure such as rapid thermal annealing (RTA) is performed between 500° C.~800° C. after the sputtering growth of the first magnetic layer 16.

The dielectric layer 18 is grown on the first magnetic layer 16 by sputtering techniques. The sputtering growth of the dielectric layer 18 is subcutaneously similar to the sputtering growth of the metal layer 28, but the only difference is that the RF power generator is used for the sputtering growth of the dielectric layer 18. DC power cannot be used for non-conductor sputtering targets owing to the current will be blocked and plasma is hence difficult to be produced, therefore there is no ion sputtering cathode target. The RF power can solve said charge accumulation on the target surface. The sputtering process of forming a dielectric layer having three crystal phases is divided into two conditions, one is room temperature sputtering for forming amorphous dielectric layer, and the other is high temperature sputtering for forming cubic and tetragonal dielectric layer. In addition, the temperature may be heated to 300° C.~600° C. before purging with argon, the heat can help the crystal growth. After sputter deposition, the sample may be sent to the heating furnace tube for subsequent post treatment and recrystallization.

The sample is then disposed into the chamber of the magnetron sputter and the chamber is evacuated down to $5\times10^{-5} \sim 5\times10^{-7}$ torr. The second oxide layer 20 is heated to 200° C.-500° C. to increase its crystallinity for inducing perpendicular magnetic moments of the second magnetic layer 22. After that, the inert gas is introduced into the chamber and the required gas flow is adjusted by the MFC. Then, turning on the power generator and the pre-sputtering is performed for removing the contaminants and oxides on the target surface. After the pre-sputtering is finished and the required gas flow reaches steady and static states, opening the shutter to perform the sputtering growth of the second oxide layer 20.

After the sputtering growth of the second oxide layer 20, the plasma of target of the second oxide layer 20 is turned off. At the same time, the temperature is heated up to 500° C.-800° C. and the second magnetic layer 22 is grown by sputtering techniques.

In order to make the second magnetic layer 22 has better crystallinity and ordering, a post-annealing procedure such as RTA is performed between 500° C.-800° C. after the sputtering growth of the second magnetic layer 22.

The second electrode 24 is grown on second magnetic layer 22 by sputtering techniques. The sputtering growth of the second electrode 24 is subcutaneously similar to the sputtering growth of the metal layer 28, but the only difference is that the DC power generator is used for the sputtering growth of the second electrode 24.

Different from conventional capacitor structure, the magnetic capacitor structure according the disclosure inserts a magnetic thin film such as iron-platinum alloy (FePt) film between the electrode and the dielectric layer, which results in that the dielectric layer capacitance generates colossal magneto-resistance effect. The internal field changes the electric polarization of the ferroelectric dielectric layer. The electric dipole moments are increased, so that more charge accumulation of the capacitor in the same area can be obtained. In addition, the metal oxide layer such as the magnesia (MgO) is provided below the magnetic thin film further induces perpendicular magnetic moments of the iron-platinum alloy (FePt), and better magnetic properties of iron-platinum alloy can be obtained by precise control of process conditions, thickness and roughness of the magnesia (MgO). The magnetic capacitor structure according to the disclosure does not involve a redox chemical reaction and does not contain electrolyte, and hence the energy efficiency can be up to 95%. The recession of chemical batteries resulted from the decrease of the electrolyte concentration reduction is therefore less likely to occur.

Embodiment 1

The Fabrication and Performance Test of the Magnetic Capacitor Structure According to the Disclosure: Pt/FePt/MgO/c-BaTiO$_3$/FePt/Mgo/Pt/Ti/SiO$_2$ Referring FIG. 1, firstly, growing the metal layer 28 (titanium with thickness 15 nm) on the metal oxide or the metal nitride layer 30 (silicon oxides with thickness 600 nm) by sputtering techniques, in which the titanium layer 28 is used as an adhesive layer between the metal oxide or the metal nitride layer 30 and the first electrode 12. The sample is disposed in the chamber evacuated by a turbo pump. When the chamber reaches a vacuum of $3\times10^{-5} \sim 3\times10^{-7}$ torr, introducing the inert gas and adjusting the required gas flow by the mass flow controller (MFC). Then, turning on the power generator, which has a better sputtering yield for metal target. After turning on the power generator, the pre-sputtering is performed for removing the contaminants and oxides on the target surface. After the pre-sputtering is finished and the required gas flow reaches steady and static states, opening the shutter to perform the sputtering growth of the metal layer 28. The parameters of the sputtering growth of the metal layer 28 are as below:

base pressure: $3\times10^{-5} \sim 3\times10^{-7}$ torr, working pressure: $3\times10^{-1} \sim 3\times10^{-5}$ torr, and distance between the target and the sample: 12 cm.

After the sputtering growth of the metal layer 28, the sputtering growth of first electrode 12 (platinum with thickness 200 nm) can be performed successively. The sputtering growth of the first electrode 12 is subcutaneously similar to the sputtering growth of the metal layer 28, but the only difference is that the DC power generator is used for the sputtering growth of the first electrode 12. The parameters of the sputtering growth of the first electrode 12 are as below:

base pressure: $3\times10^{-5}$~$3\times10^{-7}$ torr, working pressure: $1\times10^{-1}$~$1\times10^{-5}$ torr, and distance between the target and the sample: 12 cm.

The sample is then disposed into the chamber of the magnetron sputter and the chamber is evacuated down to $5\times10^{-5}$~$5\times10^{-7}$ torr. The first oxide layer 14 (MgO with thickness 5 nm) is heated to 200° C.-500° C. to increase its crystallinity for inducing perpendicular magnetic moments of the first magnetic layer 16. After that, the inert gas is introduced into the chamber and the required gas flow is adjusted by the MFC. Then, turning on the power generator and the pre-sputtering is performed for removing the contaminants and oxides on the target surface. After the pre-sputtering is finished and the required gas flow reaches steady and static states, opening the shutter to perform the sputtering growth of the first oxide layer 14. The parameters of the sputtering growth of the first oxide layer 14 are as below:

base pressure: $5\times10^{-5}$~$5\times10^{-7}$ torr, working pressure: $1\times10^{-2}$~$3\times10^{-5}$ torr, temperature is heated to 200° C.-500° C., and distance between the target and the sample: 12 cm.

After the sputtering growth of the first oxide layer 14, the plasma of target of the first oxide layer 14 is turned off. At the same time, the temperature is heated up to 500° C.-800° C. and the first magnetic layer 16 (FePt with thickness 30 nm) is grown by sputtering techniques. The parameters of the sputtering growth of the first magnetic layer 16 are as below:

base pressure: $5\times10^{-5}$~$5\times10^{-7}$ torr, working pressure: $1\times10^{-1}$~$1\times10^{-5}$ torr, temperature is heated to 500° C.-800° C., and distance between the target and the sample: 12 cm.

In order to make the first magnetic layer 16 has better crystallinity and ordering, a post-annealing procedure such as RTA is performed between 500° C.-800° C. after the sputtering growth of the first magnetic layer 16. The parameters of RTA are as below:

evacuated to 0.01~0.1 torr, heated to 500° C.-800° C., and cooling to room temperature.

The dielectric layer 18 (c-BaTiO$_3$) is grown on the first magnetic layer 16 by sputtering techniques. The sputtering growth of the dielectric layer 18 is subcutaneously similar to the sputtering growth of the metal layer 28, but the only difference is that the RF power generator is used for the sputtering growth of the dielectric layer 18. DC power cannot be used for non-conductor sputtering targets owing to the current will be blocked and plasma is hence difficult to be produced, therefore there is no ion sputtering cathode target. The RF power can solve said charge accumulation on the target surface. The sputtering process of forming a dielectric layer having three crystal phases is divided into two conditions, one is room temperature sputtering for forming amorphous dielectric layer, and the other is high temperature sputtering for forming cubic and tetragonal dielectric layer. In the embodiment, the cubic dielectric layer is formed by high temperature sputtering. The temperature is heated to 300° C.~600° C. before purging with argon, the heat can help the crystal growth. After sputter deposition, the sample may be sent to the heating furnace tube for subsequent post treatment and recrystallization. The parameters of annealing are as below:

evacuating to 3-6 torr, introducing pure oxygen (purity is greater than 90%), heating to 800° C.~1200° C., annealing 1-8 hours, and cooling.

The sample is then disposed into the chamber of the magnetron sputter and the chamber is evacuated down to $5\times10^{-5}$~$5\times10^{-7}$ torr. The second oxide layer 20 (MgO with thickness 5 nm) is heated to 200° C.-500° C. to increase its crystallinity for inducing perpendicular magnetic moments of the second magnetic layer 22. After that, the inert gas is introduced into the chamber and the required gas flow is adjusted by the MFC. Then, turning on the power generator and the pre-sputtering is performed for removing the contaminants and oxides on the target surface. After the pre-sputtering is finished and the required gas flow reaches steady and static states, opening the shutter to perform the sputtering growth of the second oxide layer 20. The parameters of the second oxide layer 20 are as below:

base pressure: $5\times10^{-5}$~$5\times10^{-7}$ torr, working pressure: $1\times10^{-2}$~$3\times10^{-5}$ torr, temperature is heated to 200° C.-500° C., and distance between the target and the sample: 12 cm.

After the sputtering growth of the second oxide layer 20, the plasma of target of the second oxide layer 20 is turned off. At the same time, the temperature is heated up to 500° C.-800° C. and the second magnetic layer 22 (FePt with thickness 30 nm) is grown by sputtering techniques. The parameters of the second magnetic layer 22 are as below:

base pressure: $5\times10^{-5}$~$5\times10^{-7}$ torr, working pressure: $1\times10^{-1}$~$1\times10^{-5}$ torr, temperature is heated to 500° C.-800° C., and distance between the target and the sample: 12 cm.

In order to make the second magnetic layer 22 has better crystallinity and ordering, a post-annealing procedure such as RTA is performed between 500° C.-800° C. after the sputtering growth of the second magnetic layer 22. The parameters of RTA are as below:

evacuated to 0.01~0.1 torr, heated to 500° C.-800° C., and cooling to room temperature.

The second electrode 24 (platinum with thickness 200 nm) is grown on second magnetic layer 22 by sputtering techniques. The sputtering growth of the second electrode 24 is subcutaneously similar to the sputtering growth of the metal layer 28, but the only difference is that the DC power generator is used for the sputtering growth of the second electrode 24. The parameters of the second electrode 24 are as below:

base pressure: $3\times10^{-5}$~$3\times10^{-7}$ torr, working pressure: $1\times10^{-1}$~$1\times10^{-5}$ torr, temperature is heated to 500° C.-800° C., and distance between the target and the sample: 12 cm.

The fabrication of the magnetic capacitor structure according to the embodiment 1 of the disclosure is accomplished by mentioned steps, in which the magnetic capacitor structure has multilayers as below: Pt/FePt/MgO/c-BaTiO$_3$/FePt/Mg o/Pt/Ti/SiO$_2$.

Figure 2:
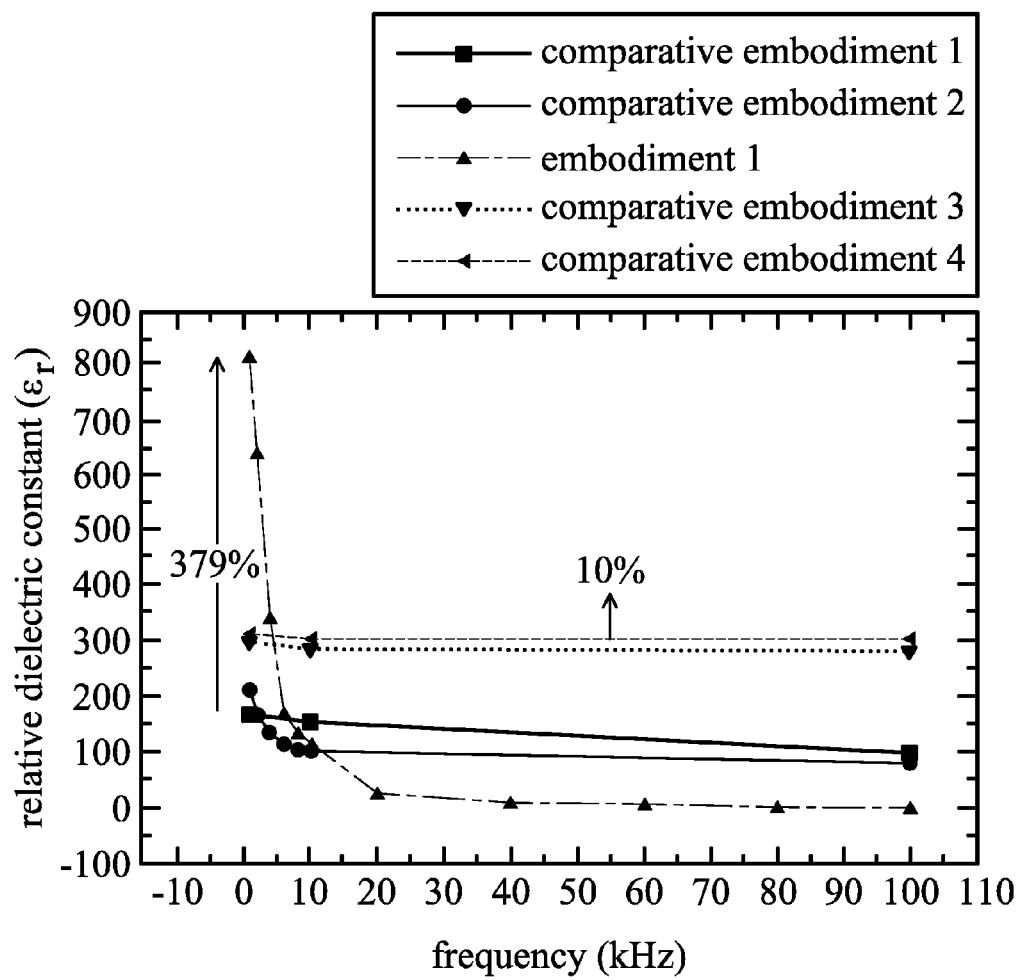
FIG. 2 shows the performance test of relative dielectric constant of the dielectric layer according to the embodiment 1 and the comparative embodiments 1-4.
Figure 3:
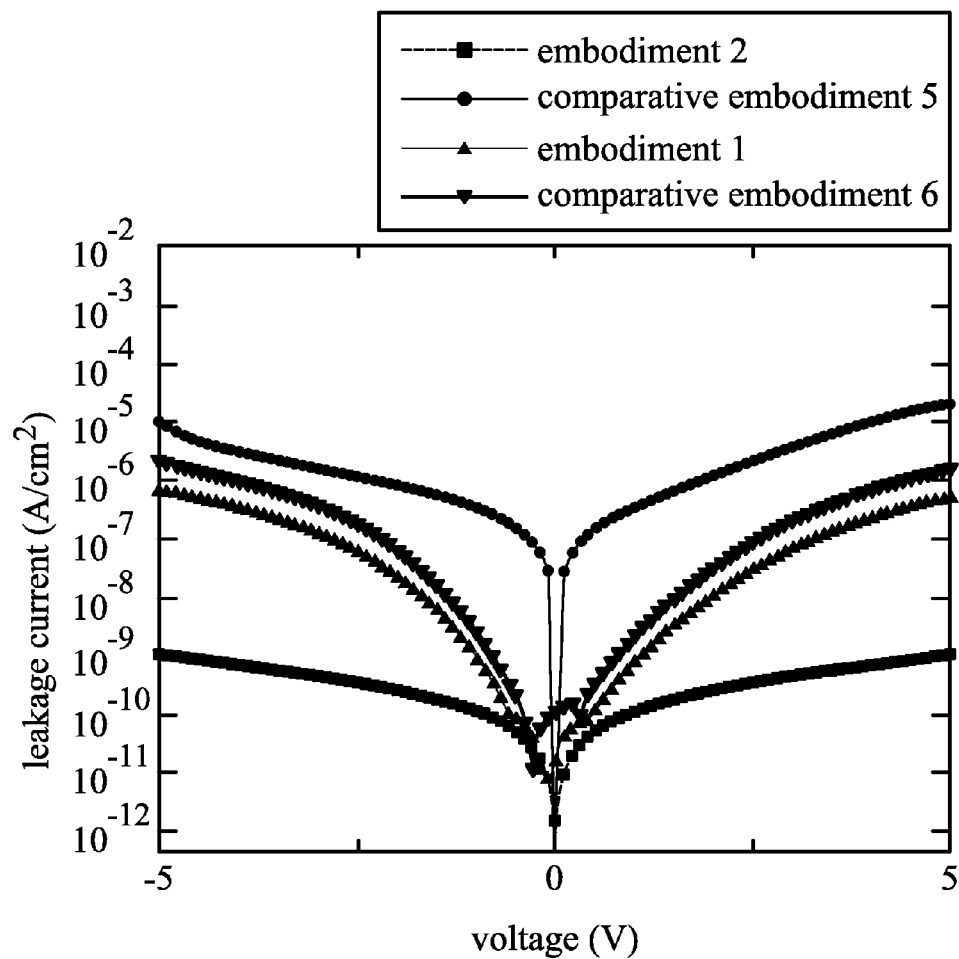
FIG. 3 shows the performance test of leakage current of the dielectric layer according to the embodiment 1-2 and the comparative embodiments 5-6.

The performance test of dielectric constant and leakage current of the dielectric layer is performed and the results are shown in FIG. 2 and FIG. 3.

Comparative Embodiment 1

The Fabrication and Performance Test of the Conventional Capacitor Structure: Pt/c-BaTiO$_3$/FePt/Pt/Ti/SiO$_2$ The multilayers according to the comparative embodiment 1 are as below: Pt/c-BaTiO$_3$/FePt/Pt/Ti/SiO$_2$ The performance test of dielectric constant of the dielectric layer according to the comparative embodiment 1 is performed and the results are shown in FIG. 2.

Comparative Embodiment 2

The Fabrication and Performance Test of the Conventional Capacitor Structure: Pt/c-BaTiO$_3$/FePt/MgO/Pt/Ti/SiO$_2$ The multilayers according to the comparative embodiment 2 are as below: Pt/c-BaTiO$_3$/FePt/MgO/Pt/Ti/SiO$_2$ The performance test of dielectric constant of the dielectric layer according to the comparative embodiment 2 is performed and the results are shown in FIG. 2.

Comparative Embodiment 3

The Fabrication and Performance Test of the Conventional Capacitor Structure: Pt/c-BaTiO$_3$/Pt/Ti/SiO$_2$ (without External Magnetic Field)

The multilayers according to the comparative embodiment 2 are as below: Pt/c-BaTiO$_3$/Pt/Ti/SiO$_2$ The performance test of dielectric constant of the dielectric layer according to the comparative embodiment 3 is performed and the results are shown in FIG. 2.

Comparative Embodiment 4

The Fabrication and Performance Test of the Conventional Capacitor Structure: Pt/c-BaTiO$_3$/Pt/Ti/SiO$_2$ (Applying External Magnetic Field 1 Tesla)

The multilayers according to the comparative embodiment 4 are as below: Pt/c-BaTiO$_3$/Pt/Ti/SiO$_2$ The performance test of dielectric constant of the dielectric layer according to the comparative embodiment 4 is performed and the results are shown in FIG. 2.

Embodiment 2

The Fabrication and Performance Test of the Magnetic Capacitor Structure According to the Disclosure: Pt/FePt/MgO/a-BaTiO$_3$/FePt/Mgo/Pt/Ti/SiO$_2$ Referring FIG. 1, firstly, growing the metal layer 28 (titanium with thickness 15 nm) on the metal oxide or the metal nitride layer 30 (silicon oxides with thickness 600 nm) by sputtering techniques, in which the titanium layer 28 is used as an adhesive layer between the metal oxide or the metal nitride layer 30 and the first electrode 12. The sample is disposed in the chamber evacuated by a turbo pump. When the chamber reaches a vacuum of $3\times10^{-5} \sim 3\times10^{-7}$ torr, introducing the inert gas and adjusting the required gas flow by the mass flow controller (MFC). Then, turning on the power generator, which has a better sputtering yield for metal target. After turning on the power generator, the pre-sputtering is performed for removing the contaminants and oxides on the target surface. After the pre-sputtering is finished and the required gas flow reaches steady and static states, opening the shutter to perform the sputtering growth of the metal layer 28. The parameters of the sputtering growth of the metal layer 28 are as below:

base pressure: $3\times10^{-5} \sim 3\times10^{-7}$ torr, working pressure: $3\times10^{-1} \sim 3\times10^{-5}$ torr, and distance between the target and the sample: 12 cm.

After the sputtering growth of the metal layer 28, the sputtering growth of first electrode 12 (platinum with thickness 200 nm) can be performed successively. The sputtering growth of the first electrode 12 is subcutaneously similar to the sputtering growth of the metal layer 28, but the only difference is that the DC power generator is used for the sputtering growth of the first electrode 12. The parameters of the sputtering growth of the first electrode 12 are as below:

base pressure: $3\times10^{-5} \sim 3\times10^{-7}$ torr, working pressure: $1\times10^{-1} \sim 1\times10^{-5}$ torr, and distance between the target and the sample: 12 cm.

The sample is then disposed into the chamber of the magnetron sputter and the chamber is evacuated down to $5\times10^{-5}$-$5\times10^{-7}$ torr. The first oxide layer 14 (MgO with thickness 5 nm) is heated to 200° C.-500° C. to increase its crystallinity for inducing perpendicular magnetic moments of the first magnetic layer 16. After that, the inert gas is introduced into the chamber and the required gas flow is adjusted by the MFC. Then, turning on the power generator and the pre-sputtering is performed for removing the contaminants and oxides on the target surface. After the pre-sputtering is finished and the required gas flow reaches steady and static states, opening the shutter to perform the sputtering growth of the first oxide layer 14. The parameters of the sputtering growth of the first oxide layer 14 are as below:

base pressure: $5\times10^{-5} \sim 5\times10^{-7}$ torr, working pressure: $1\times10^{-2} \sim 3\times10^{-5}$ torr, temperature is heated to 200° C.-500° C., and distance between the target and the sample: 12 cm.

After the sputtering growth of the first oxide layer 14, the plasma of target of the first oxide layer 14 is turned off. At the same time, the temperature is heated up to 500° C.-800° C. and the first magnetic layer 16 (FePt with thickness 30 nm) is grown by sputtering techniques. The parameters of the sputtering growth of the first magnetic layer 16 are as below:

base pressure: $5\times10^{-5} \sim 5\times10^{-7}$ torr, working pressure: $1\times10^{-1} \sim 1\times10^{-5}$ torr, temperature is heated to 500° C.-800° C., and distance between the target and the sample: 12 cm.

In order to make the first magnetic layer 16 has better crystallinity and ordering, a post-annealing procedure such as RTA is performed between 500° C.-800° C. after the sputtering growth of the first magnetic layer 16. The parameters of RTA are as below:

evacuated to 0.01~0.1 torr, heated to 500° C.-800° C., and cooling to room temperature.

The dielectric layer 18 (amorphous BaTiO3 (a-BaTiO$_3$) with thickness 100 nm) is grown on the first magnetic layer 16 by sputtering techniques. The sputtering growth of the dielectric layer 18 is subcutaneously similar to the sputtering growth of the metal layer 28, but the only difference is that the RF power generator is used for the sputtering growth of the dielectric layer 18. DC power cannot be used for non-conductor sputtering targets owing to the current will be blocked and plasma is hence difficult to be produced, therefore there is no ion sputtering cathode target. The RF power can solve said charge accumulation on the target surface. The sputtering process of forming a dielectric layer having three crystal phases is divided into two conditions, one is room temperature sputtering for forming amorphous dielectric layer, and the other is high temperature sputtering for forming cubic and tetragonal dielectric layer. In the embodiment, the cubic dielectric layer is formed by high temperature sputtering. The temperature is heated to 300° C.~600° C. before purging with argon, the heat can help the crystal growth. After sputter deposition, the sample may be sent to the heating furnace tube for subsequent post treatment and recrystallization. The parameters of annealing are as below:

evacuating to 3-6 torr, introducing pure oxygen (purity is greater than 90%), heating to 800° C.~1200° C., annealing 1~8 hours, and cooling.

The sample is then disposed into the chamber of the magnetron sputter and the chamber is evacuated down to $5\times10^{-5}$~$5\times10^{-7}$ torr. The second oxide layer 20 (MgO with thickness 5 nm) is heated to 200° C.-500° C. to increase its crystallinity for inducing perpendicular magnetic moments of the second magnetic layer 22. After that, the inert gas is introduced into the chamber and the required gas flow is adjusted by the MFC. Then, turning on the power generator and the pre-sputtering is performed for removing the contaminants and oxides on the target surface. After the pre-sputtering is finished and the required gas flow reaches steady and static states, opening the shutter to perform the sputtering growth of the second oxide layer 20. The parameters of the second oxide layer 20 are as below:

base pressure: $5\times10^{-5}$~$5\times10^{-7}$ torr, working pressure: $1\times10^{-2}$~$3\times10^{-5}$ torr, temperature is heated to 200° C.-500° C., and distance between the target and the sample: 12 cm.

After the sputtering growth of the second oxide layer 20, the plasma of target of the second oxide layer 20 is turned off. At the same time, the temperature is heated up to 500° C.-800° C. and the second magnetic layer 22 (FePt with thickness 30 nm) is grown by sputtering techniques. The parameters of the second magnetic layer 22 are as below:

base pressure: $5\times10^{-5}$~$5\times10^{-7}$ torr, working pressure: $1\times10^{-1}$~$1\times10^{-5}$ torr, temperature is heated to 500° C.-800° C., and distance between the target and the sample: 12 cm.

In order to make the second magnetic layer 22 has better crystallinity and ordering, a post-annealing procedure such as RTA is performed between 500° C.-800° C. after the sputtering growth of the second magnetic layer 22. The parameters of RTA are as below:

evacuated to 0.01~0.1 torr, heated to 500° C.-800° C., and cooling to room temperature.

The second electrode 24 (platinum with thickness 200 nm) is grown on second magnetic layer 22 by sputtering techniques. The sputtering growth of the second electrode 24 is subcutaneously similar to the sputtering growth of the metal layer 28, but the only difference is that the DC power generator is used for the sputtering growth of the second electrode 24. The parameters of the second electrode 24 are as below:

base pressure: $3\times10^{-5}$~$3\times10^{-7}$ torr, working pressure: $1\times10^{-1}$~$1\times10^{-5}$ torr, temperature is heated to 500° C.-800° C., and distance between the target and the sample: 12 cm.

The fabrication of the magnetic capacitor structure according to the embodiment 1 of the disclosure is accomplished by mentioned steps, in which the magnetic capacitor structure has multilayers as below: Pt/FePt/MgO/a-BaTiO$_3$/FePt/Mgo/Pt/Ti/SiO$_2$.

The performance test of leakage current is performed and the results are shown in FIG. 3.

Comparative Embodiment 5

The Fabrication and Performance Test of the Conventional Magnetic Capacitor Structure: Pt/FePt/c-BaTiO$_3$/FePt/Pt/Ti/SiO$_2$ The multilayers according to the comparative embodiment 5 are as below: Pt/FePt/c-BaTiO$_3$/FePt/Pt/Ti/SiO$_2$ The performance test of dielectric constant of the dielectric layer according to the comparative embodiment 5 is performed and the results are shown in FIG. 3.

Comparative Embodiment 6

The Multilayers According to the Comparative Embodiment 6 are as Below: Pt/FePt/a-BaTiO$_3$/FePt/Pt/Ti/SiO$_2$ The performance test of dielectric constant of the dielectric layer according to the comparative embodiment 6 is performed and the results are shown in FIG. 3.

As shown in FIG. 2, the magnetic metal/insulator/magnetic metal (MM-I-MM) structure (i.e. Pt/FePt/MgO/c-BaTiO$_3$/FePt/MgO/Pt/Ti/SiO$_2$) according to the embodiment 1 can produce a magnetocapacitance greater than that of the conventional capacitor structure up to 379% at room temperature (1 KHz). The magnetic field in the magnetic thin film contributes to the dielectric constant of the dielectric layer, which results in the greater magnetocapacitance than the conventional capacitors. The internal magnetic field affects the electric dipoles in this frequency range, so that the atoms and dislocated ions in the BaTiO$_3$ film (charge imbalance distribution) are rearranged more ordered, which creates more electric dipoles and increases the capacitance in the frequency range. Besides, the leakage current of the MM-I-MM structure having the MgO film is lower than that of the MM-I-MM structure without the MgO film (Pt/FePt/c-BaTiO$_3$/FePt/Pt/Ti/SiO$_2$).

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A magnetic capacitor structure, comprising:
a first electrode;
a second electrode, disposed opposite to the first electrode;
a dielectric layer, disposed between the first electrode and the second electrode;
a first magnetic layer, disposed between the first electrode and the dielectric layer;
a second magnetic layer, disposed between the second electrode and the dielectric layer;
a first oxide layer directly disposed on the first electrode; and
a second oxide layer, directly disposed on the dielectric layer, wherein the first oxide layer and the second oxide layer are composed of magnesium oxide (MgO), lanthanum strontium manganite (LSMO) or lead zirconium titanate (PZT).
2. The magnetic capacitor structure of claim 1, wherein the first electrode and the second electrode are composed of platinum (Pt) or aluminum (Al).

3. The magnetic capacitor structure of claim 1, wherein the dielectric layer is composed of silicon oxide, titanium oxide, barium titanate ($BaTiO_3$), or chromium based spinel ($CdCr_2S_4$).

4. The magnetic capacitor structure of claim 1, wherein crystalline phases of the dielectric layer comprise an amorphous phase and a cubic phase.

5. The magnetic capacitor structure of claim 1, wherein a grain size of the dielectric layer is between 100 nm to 300 nm.

6. The magnetic capacitor structure of claim 1, wherein the first magnetic layer and the second magnetic layer are composed of iron-platinum alloy (FePt) or cobalt-platinum alloy (CoPt).

7. The magnetic capacitor structure of claim 1, further comprising a passivation layer forming on the first electrode or the second electrode.

8. The magnetic capacitor structure of claim 7, wherein the passivation layer is composed of a metal layer, a metal oxide or metal nitride layer or the combinations thereof.

9. The magnetic capacitor structure of claim 7, further comprising a silicon substrate forming on the passivation layer.

\* \* \* \* \*